United States Patent [19]

Pfahl, Jr. et al.

[11] Patent Number: 5,395,548
[45] Date of Patent: Mar. 7, 1995

[54] NON-AZEOTROPIC SOLVENT COMPOSITION FOR CLEANING AND DEFLUXING ELECTRICAL ASSEMBLIES

[75] Inventors: Robert C. Pfahl, Jr., Glen Ellyn; James A. Wrezel, Buffalo Grove; Lawrence R. Hagner, Naperville, all of Ill.

[73] Assignee: Motorola, Inc., Schaumburg, Ill.

[21] Appl. No.: 44,882

[22] Filed: Apr. 6, 1993

Related U.S. Application Data

[63] Continuation of Ser. No. 759,301, Sep. 13, 1991, abandoned, which is a continuation-in-part of Ser. No. 469,117, Jan. 24, 1990, abandoned.

[51] Int. Cl.$^6$ ................ C23G 5/024; C23G 5/028; C11D 7/28
[52] U.S. Cl. ................................. 252/162; 252/164; 252/170; 134/40
[58] Field of Search ....... 252/162, 164, 170, DIG. 14; 134/40, 42

[56] References Cited

U.S. PATENT DOCUMENTS

| | | | |
|---|---|---|---|
| 4,276,186 | 6/1981 | Bakos et al. | 252/171 X |
| 4,640,719 | 2/1987 | Hayes et al. | 134/40 |
| 4,666,626 | 5/1987 | Francisco | 252/170 X |
| 4,828,751 | 5/1989 | Kremer | 252/162 X |
| 4,867,800 | 9/1989 | Dishart et al. | 134/40 |
| 5,013,485 | 5/1991 | Tsukuda et al. | 252/162 X |

*Primary Examiner*—Richard O. Dean
*Assistant Examiner*—Saeed Chaudhry
*Attorney, Agent, or Firm*—Jasper W. Dockrey; Kenneth W. Bolvin

[57] ABSTRACT

A distillable, non-azeotropic solvent mixture for electronic assembly cleaning in order to adequately remove solder flux and other residues traditionally removed using CFC-based azeotropes. The mixture is heated to at least the boiling point of component A but less than the boiling point of component B. Component A vaporizes (102), forming a vapor layer above the mixture (103). Condensing elements (101) near the top of the cleaning apparatus condense the vapor (102), returning it to the heated mixture (103) to be vaporized again. The assembly (104) to be cleaned is lowered through the vapor and then immersed in the mixture (103) before being positioned in the vapor (102).

13 Claims, 1 Drawing Sheet

NON-AZEOTROPIC SOLVENT COMPOSITION FOR CLEANING AND DEFLUXING ELECTRICAL ASSEMBLIES

This application is a continuation of prior application Ser. No. 759.301, filed Sep. 13, 1991, now abandoned which is a continuation-in-part of application Ser. No. 07/469,117, filed Jan. 24, 1990, and now abandoned.

FIELD OF THE INVENTION

The present invention relates generally to the field of manufacturing processes and particularly to the cleaning of electrical assemblies.

BACKGROUND OF THE INVENTION

Soldering components to a circuit board assembly typically leaves contaminants such as solder flux, resins, and ionic compounds. These contaminants must be removed if the circuit board assembly is to be sealed from the elements by a protective coating. The protective coating may not properly adhere to an assembly containing contaminants. The contaminants may also be removed for aesthetic purposes, to prevent corrosion, or to increase the assembly's insulation resistance.

The cleaning process to remove the contaminants is usually done with chlorofluorocarbon (CFC) based solvents in liquid or vapor form. These solvents are frequently an azeotrope of trichloro-trifluoroethane and another solvent such as an alcohol, an example being methanol. One such solvent is a fluorinated hydrocarbon manufactured by E. I. DuPont de Nemours & Co. and marketed under the trade name FREON TMS.

The cleaning process is typically accomplished by placing the solvent in a container having heating elements at the bottom and condensing elements near the top. The solvent is then heated to its boiling temperature of 43.3° C., producing a solvent vapor above the liquid solvent. The circuit board or electronic assembly to be cleaned is placed in the vapor. The electronic assembly, being at a lower temperature than the vapor, causes the vapor to condense on the assembly, thereby cleaning off the contaminants by dissolving or flushing off the contaminants.

The vapor that did not condense on the electronic assembly is retained in the cleaning apparatus by the condensing elements. These elements, typically operated at a temperature of 10° C., cause the higher temperature vaporized solvent to condense back to liquid, returning to the bottom of the container to repeat the cycle. While the condensing elements in the container keep most of the solvent in the container, some of the solvent diffuses across the air-solvent interface and therefore escapes into the atmosphere. In addition, the assemblies being cleaned may retain small amounts of solvent on their surfaces after removal from the cleaning apparatus. Also, the spilling of solvent by workers refilling the cleaning apparatus can release the solvent into the atmosphere.

The solvent must be retained in the apparatus due to its expense and because of environmental concerns. In recent years, scientific studies have shown that CFCs have been depleting the protective ozone layer above the Earth, causing holes to form in this layer.

Alcohols such as isopropyl, methanol, or ethanol have been tried as an alternative to CFC based solvents. The assembly to be cleaned is initially immersed in and then sprayed with isopropyl alcohol, dissolving and/or washing off the contaminants. Alcohol, while it adequately removes ionic material from the assembly, may leave a white residue. Customers buying the assembly might get the impression that the assembly has not been cleaned or is defective in some way. There is a resulting need for an environmentally safe cleaning solvent that removes ionic material and does not leave a residue on the assembly being cleaned.

SUMMARY OF THE INVENTION

The present invention utilizes a non-azeotropic solvent mixture for printed circuit board or assembly cleaning that does not contain ozone-depleting chemicals. The solvent mixture contains a distillable, low to moderate boiling point halogenated or non-halogenated alcohol, in conjunction with a less volatile, higher boiling point terpene compound or N-methylpyrrolidinone. The invention also relates to a process for cleaning, whereby the article to be cleaned is immersed in the heated solvent mixture, the latter heated to a temperature sufficient to distill the low to moderate boiling point alcohol and create a vapor zone containing the essentially-purified component for the purpose of drying. The cleaned article is withdrawn from the heated solvent mixture, maintained in the vapor zone for drying, then removed in a cleaned and dried state. The compositions of matter do not incorporate chlorofluorocarbon or other chemicals that deplete the ozone layer.

BRIEF DESCRIPTION OF THE DRAWINGS

The Figure shows the cross section of an apparatus for practicing the method of the present method.

DETAILED DESCRIPTION OF THE PREFERRED EMBODIMENT

Figure 1:
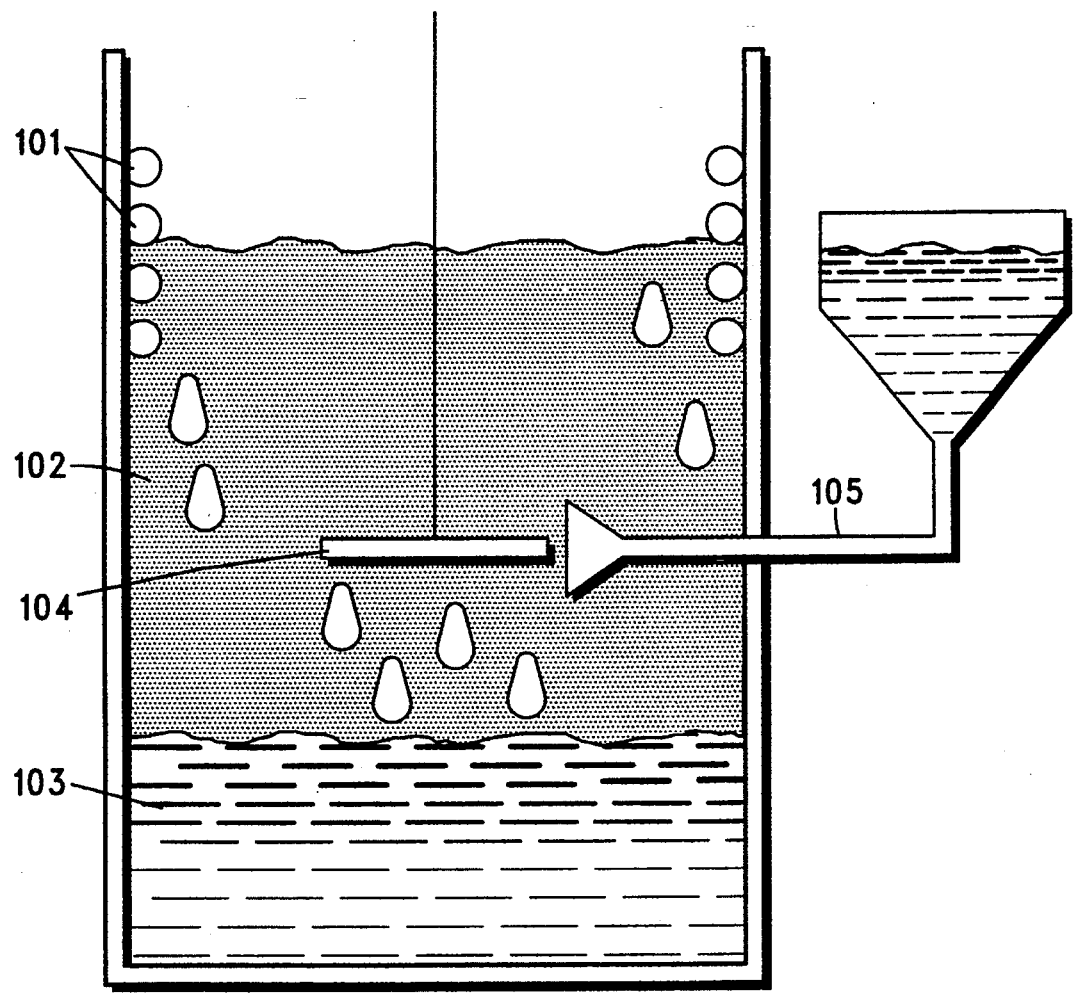

The composition of the present invention comprises miscible liquids for cleaning and defluxing printed circuit assemblies. The first component, subsequently referred to as component A, is a distillable halogenated or non-halogenated alcohol. The second component, subsequently referred to as component B, is a relatively non-volatile organic liquid from the terpene family or a high boiling point aprotic solvent.

In the preferred embodiment, component A represents 5 to 95 parts by weight of a halogenated or non-halogenated alcohol containing from two (2) to four (4) carbon atoms. Also in the preferred embodiment, component B comprises from 5 to 95 parts by weight of a monocyclic or bicyclic terpene, terpene alcohol or mixture thereof. Examples of alcohols suitable for this invention include isopropanol, ethanol, n-propanol, n-butanol, 2,2,3,3,3-pentafluoropropanol, 1,1,1,2,2--pentafluoro-3-propanol, and others. Examples of component B include dipentene, d-limonene, l-limonene, a-terpinene, g-terpinene, carene, camphene, terpinolene, a-pinene, b-pinene, a-terpineol, geraniol, linalool, nerol, and other compounds from the p-menthadiene family.

Additionally, the present invention utilizes a composition of matter useful for cleaning and defluxing printed circuit boards where component B comprises from 5 to 95 parts by weight of N-methylpyrrolidinone (NMP). The use of other aprotic solvents of this type can be envisioned within the scope of this invention.

The compositions of matter disclosed may absorb water in the course of equipment idling or operation via atmospheric humidity or assembly drag-in. This water may be considered part of the distillable cleaning fluid composition, although its presence can be controlled via desiccation if necessary.

The present invention utilizes a cleaning fluid mixture that is non-azeotropic in order to generate essentially purified component A vapor upon heating the miscible liquid mixture at a temperature above the boiling point of component A. The component A vapor is generated via distillation, and accompanied by condensation to provide a vapor zone above the liquid mixture. The necessity for a non-azeotropic solvent mixture can be understood through consideration of a preferred embodiment of this invention, wherein component A is 2,2,3,3,3-pentafluoropropanol. The formation of essentially pure fluorinated alcohol vapor upon distillation of a mixture containing the liquid alcohol plus terpenes will ensure that air will not form a combustible mixture with the heated liquid phase containing terpenes. Azeotropic mixtures can contain sufficient quantities of auxiliary constituents in the vapor phase that, if present as combustible or flammable compounds, can be hazardous if a source of ignition is present and the flammability limit is exceeded.

The vapor density of the pentafluoropropanol in the preferred embodiment is substantially greater than air, allowing stability of the air/fluorinated alcohol interface with minimal air diffusion to the heated mixture containing combustible constituents. Furthermore, the operation of the compositions of matter containing terpene compounds is advantageous for minimizing air oxidation of the terpenes under heated conditions. Terpenes such as d-limonene and carene can undergo oxidation when heated in the presence of air. Antioxidants can be added to the compositions of matter disclosed herein to minimize terpene compound oxidation and decomposition. The non-azeotropic compositions of matter disclosed herein generate essentially pure alcohols upon distillation, such that only trace quantities of warm terpene vapors are generated. The result is enhanced thermooxidative stability of terpene compounds.

The constituents of the compositions of matter described in the present invention perform particular cleaning functions. The lower boiling point halogenated and non-halogenated alcohols are excellent solvents for polar and ionic contamination, such as salts and flux activators. The higher boiling point terpene compounds and N-methylpyrrolidinone are excellent solvents for non-polar and hydrophobic constituents, such as oils, grease, rosin and other solder paste additives. The heated cleaning fluid mixture contains a balance of solvency power for the flux residues typically found on wave soldered and surface mount assemblies. The lower boiling point, distillable alcohols generate a vapor phase above the heated solution that serves as a drying agent in the present invention. The alcohols can also be employed as rinsing agents within the vapor zone to remove the dirty, heated fluid mixture from the cleaned articles.

The individual components A and B possess certain physical properties that are desirable for maintaining the cleaning process of the present invention. The boiling point of component A must be substantially less than the boiling point or boiling point range of component B to ensure the distillate is essentially pure, such that headspace or "free board" above the heated liquid reservoir can be minimized. This is equivalent to a solvent distillation with minimal theoretical plates. In addition, the latent heat of vaporization of component A is sufficiently less than the other components to permit vaporization with minimal energy input. The greater vapor density of component A in comparison to air is essential for the reasons described earlier.

The compositions of matter of the present invention are utilized in a process for cleaning and defluxing printed circuit boards. The actual proportion of components A and B is determined by machine geometry and desired solvency characteristics. In practice, a sufficient quantity of component A (e.g. halogenated or non-halogenated alcohol) is required such that the cleaning apparatus headspace (or "free board") is filled with alcohol vapor when the liquid components A and B are heated. The headspace volume can be calculated if the solution height and condenser position are known. Moreover, some component A liquid is desirable in the heated solution to reduce the operating temperature to below 120° C., thereby minimizing solvent oxidation and shock to printed circuit boards. The volume of the non-azeotropic solvent mixture must be sufficient to permit immersion of the article to be cleaned.

Cleaning of printed circuit assemblies is effected by immersing the article in a heated mixture of components A and B. The temperature of the mixture is regulated so as to permit distillation of component A in an essentially pure form. Those skilled in the art of distillation will recognize that the heated mixture temperature must be greater than that of the pure component A boiling point as a result of boiling point elevation, but less than the component B boiling point. In practice, the heated mixture temperature is 5 to 15° C. greater than the component A vapor temperature. The temperature of the heated mixture that generates component A vapor is dependent on the ratio of component A to B in the mixture, as well as on the quantity of volatile matter. In general, component A diffusional losses must be compensated for by the introduction of pure component A liquid in order to maintain the heated mixture temperature within specified control limits. Thermostats and other temperature sensing elements are required in the cleaning apparatus for control purposes. The duration of exposure, through immersion, spray under immersion or other means, of the article to be cleaned is dependent on the nature of the post-soldering residues, the length of time after soldering and other factors.

The distilled component A is condensed above the level of the heated mixture, at a distance defined by machine geometry and required "free board", and allowed to return to the heated mixture. Alternatively, the condensate comprising essentially purified component A can be withdrawn to a separate tank for use in rinsing articles after immersion in the non-azeotropic heated mixture. The headspace containing essentially pure component A vapor is employed for either 1) drying the cleaned assembly for a given duration to remove liquid from the article, or 2) providing a vapor zone for rinsing using component A in purified form. The component A vapor provides an efficient medium for drying as the cleaned article leaves the heated solution mixture at a temperature greater than the vapor temperature, thereby facilitating the drying process. The article can be removed from the component A vapor zone after an appropriate time and tested for ionic cleanliness levels or sent to the next stage of manufacturing.

The condensate containing essentially pure component A can be employed alternatively for rinsing the article previously immersed in the heated, non-azeotropic solvent mixture in order to remove the higher boiling constituents containing flux and other soils. Rinsing can be performed via spraying or other means, and is conducted within the vapor zone so that the fluid can be collected after contacting the cleaned article through condensation, along with distilled component A. Drying after rinsing is effected by maintaining the cleaned article in the vapor zone and interrupting the flow of rinse solution.

The bottom of the apparatus, illustrated in the Figure, is filled with the non-azeotropic liquid mixture (103). The mixture is heated to a temperature greater than the boiling point of component A. The component A liquid will then vaporize into a layer (102) above the heated mixture (103). Component B, by virtue of its higher boiling point versus component A, will remain in liquid form below the vapor layer (102).

The assembly (104) to be cleaned is first placed in the heated mixture containing components A and B (103) by passing it through the vapor. Next, the assembly (104) is positioned in the vapor layer (102) where it can be sprayed with the condensate containing essentially pure component A (105) to remove the remaining contaminants. The condensate (105), when it strikes the assembly (104), will atomize. This atomization may present the risk of explosion if the atomized mist was exposed to the atmosphere. One purpose of the vapor (102), therefore, is to isolate the heated liquid (103) from the atmosphere.

The vapor (102) mixes with the atomized liquid mixture from the assembly being cleaned. This vapor mixture is then condensed by the condensing elements (101). The now liquid component A and B mixture is returned to the heated liquid mixture (103) below where the component A liquid is again vaporized to repeat the cycle. The condensing elements (101), therefore, retain the vapor (102) that, in turn, retains the heated liquid mixture (103).

Another function of the condensate containing essentially pure component A is to rinse off the solution that is contaminated with flux. Component A then evaporates more rapidly than component B due to its higher vapor pressure. The evaporation dries the assembly.

Alternatively, the assembly (104) can be positioned in the vapor layer (102) subsequent to immersion in the heated liquid (103) without being sprayed for the purpose of drying.

The following examples are included to illustrate the process of the present invention:

1- A distillable cleaning solvent mixture was prepared by mixing 200 mL of a commercial pine-based terpene mixture (marketed under the tradename Reentry KNI 2000 by Envirosolv Inc.) and 50 mL of 2,2,3,3,3-pentafluoropropanol, wherein the mixture contains 30 wt % pentafluoropropanol. The solution was placed in a one liter beaker and fitted with a water-cooled condenser coil around the opening. The cleaning solvent mixture was heated to a temperature sufficient to distill the more volatile pentafluoropropanol component from the solvent mixture, generating a vapor zone between the solution and cold condenser coil boundaries. A thermometer indicated a solvent mixture temperature of 95° C. and a vapor zone temperature range of 83° C. to 86° C.

A printed circuit assembly that was wave soldered using a commercial, mildly-activated rosin flux was immersed in the warm solvent mixture for one minute in order to deflux the assembly. The board was raised above the solution level within the vapor zone and maintained for two minutes in order to dry the assembly. Upon removal from the vapor zone, the board was dry and free of flux residue as evidenced by optical microscopy.

2- The mixture and process of Example #1 was employed to clean a board wave soldered with a commercially-available rosin flux. After immersion in the warm solvent mixture for one minute, the board was withdrawn and rinsed with essentially purified, distilled pentafluoropropanol liquid within the vapor zone above the solution level for the purpose of rinsing the solvent mixture (containing flux) from the assembly. The latter was then exposed to the essentially pure pentafluoropropanol vapor for drying the assembly. The board appeared dry and free of flux residue upon removal from the vapor zone.

3- A mixture containing 60 mL of a commercial pine-based terpene mixture (marketed under the tradename Reentry KNI 2000 by Envirosolv Inc.) and 20 mL of 2,2,3,3,3-pentafluoropropanol was heated in a 250 mL beaker fitted with a water-cooled condenser around the opening. The solvent blend was heated to generate a vapor zone containing the essentially pure fluorinated alcohol with no odor of terpene. The liquid mixture and vapor zone temperatures were 87° C. and 81° C., respectively. A lighted match when dropped through the vapor zone into the warm fluid was extinguished while in the vapor zone of the non-flammable fluorinated alcohol.

The same experiment, when conducted without a fluorinated alcohol vapor blanket, led to burning and combustion of the terpene-based liquid.

In summary, the present invention utilizes a distillable, non-azeotropic solvent mixture for printed circuit assembly cleaning in order to adequately remove solder flux and other residues traditionally removed using CFC-based azeotropes. The mixture is suitable for use in batch degreaser cleaning equipment, and utilizes chemistry that is non-ozone depleting, yet effective at removal of polar and non-polar soils typically found on circuit boards after soldering.

We claim:

1. A non-azeotropic solvent composition for cleaning and defluxing electrical assemblies, the composition comprising:
    a first element comprised of from 5 to 95 parts by weight of a distillable halogenated alcohol comprising from two to four carbon atoms; and
    a second element comprised of from 5 to 95 parts by weight of a monocyclic terpene, wherein vapors from the halogented alcohol form a vapor barrier over the monocyclic terpene.

2. The non-azeotropic solvent composition of claim 1 wherein the second element is comprised of from 5 to 95 parts by weight of N-methylpyrrolidinone (NMP).

3. The non-azeotropic solvent composition of claim 1 wherein the composition contains moisture during use.

4. The non-azeotropic solvent composition of claim 1 wherein the composition is heated to a temperature in the range of 50° to 160° C. at atmospheric pressure and an essentially pure vapor comprised of the first element is present above the solvent mixture.

5. The non-azeotropic solvent composition of claim 1 wherein the first element is isopropanol.

6. The non-azeotropic solvent composition of claim 1 wherein the first element is 2,2,3,3,3-pentafluoropropanol.

7. The non-azeotropic solvent composition of claim 1 wherein the second element is a terpene hydrocarbon mixture.

8. The non-azeotropic solvent composition of claim 1 wherein the second element is a monocyclic terpene hydrocarbon containing ten carbon atoms.

9. The non-azeotropic solvent composition of claim 1 wherein the second element is a monocyclic terpene hydrocarbon and monocyclic terpene alcohol mixture, both containing ten carbon atoms.

10. The non-azeotropic solvent composition of claim 1 wherein the second element contains from 5 to 95 parts by weight of a monocyclic terpene hydrocarbon and from 5 to 95 parts by weight of a monocyclic terpene alcohol.

11. A non-azeotropic solvent composition for cleaning and defluxing printed circuit boards, the composition comprising:
    a first element comprised of from 5 to 95 parts by weight of a distillable non-halogenated alcohol comprising from two to four carbon atoms; and
    a second element comprised of from 5 to 95 parts by weight of a monocyclic terpene, wherein vapors from the alcohol form a vapor barrier over the monocyclic terpene.

12. A non-azeotropic solvent composition for cleaning and defluxing printed circuit boards, the composition comprising:
    a first element comprised of from 5 to 95 parts by weight of a distillable halogenated or non-halogenated alcohol containing from two to four carbon atoms; and
    a second element comprised of from 5 to 95 parts by weight of a bicyclic terpene, wherein vapors from the alcohol form a vapor barrier over the bicyclic terpene.

13. A non-azeotropic solvent composition for cleaning and defluxing printed circuit boards, the composition comprising:
    a first element comprised of from 5 to 95 parts by weight of a distillable halogenated or non-halogenated alcohol containing from two to four carbon atoms; and
    a second element comprised of from 5 to 95 parts by weight of a terpene alcohol, wherein vapors from the alcohol form a vapor barrier over the terpene alcohol.

* * * * *